(12) United States Patent
Taha et al.

(10) Patent No.: US 7,353,436 B2
(45) Date of Patent: Apr. 1, 2008

(54) SYNCHRONIZATION CODE METHODS

(75) Inventors: Ali Taha, Calabasas, CA (US); John Eldon, Encinitas, CA (US)

(73) Assignee: Pulse-LINK, Inc., Carlsbad, CA (US)

( * ) Notice: Subject to any disclaimer, the term of this patent is extended or adjusted under 35 U.S.C. 154(b) by 401 days.

(21) Appl. No.: 10/897,281

(22) Filed: Jul. 21, 2004

(65) Prior Publication Data

US 2006/0020433 A1 Jan. 26, 2006

(51) Int. Cl.
*G06F 11/00* (2006.01)

(52) U.S. Cl. ........................ 714/701; 714/777

(58) Field of Classification Search ............... 714/701, 714/777
See application file for complete search history.

(56) References Cited

U.S. PATENT DOCUMENTS

| | | | | |
|---|---|---|---|---|
| 4,649,543 | A * | 3/1987 | Levine | 714/774 |
| 4,680,765 | A * | 7/1987 | Doland | 714/775 |
| 6,140,947 | A | 10/2000 | Livingston | |
| 6,229,460 | B1 | 5/2001 | Tsai et al. | |
| 6,567,393 | B2 | 5/2003 | Hamalainen et al. | |
| 2002/0077139 | A1* | 6/2002 | Bouet | 455/522 |
| 2003/0099280 | A1 | 5/2003 | Kumar et al. | |
| 2005/0251387 | A1* | 11/2005 | Jelinek et al. | 704/223 |

OTHER PUBLICATIONS

Kenneth G. Paterson, Sequences for OFDM and Multi-Code CDMA: Two Problems in Algebraic Coding Theory, Jun. 19, 2001, 27 Pages, Bristol, UK.

R. Neil Braithwaite, Using Walsh Code Selection to Reduce the Power Variance of Bandlimited Forward-link CDMA Waveforms, Jul. 1999, 26 Pages, Palo Alto, CA.

Cebrail Ciftlikli & Ibrahim Develi, A Modified Approach to Determine the Most Appropriate Spreading Codes for a DS/CDMA System with Exponentially Weighted Despreading Sequences, Journal of Information Science and Engineering 19, pp. 1041-1057, Mar. 10, 2003, 17 Pages, Kayseri, Turkey.

William Stallings, Data and Computer Communications, Pearson Education, 7th Edition, pp. 172-202, 2004, 19 Pages, India.

Sanhae Kim, Kwang-Hee Park, Suckchel Yang, Hak-Seong Kim & Yoan Shin, Time Hopping Sequences Based on Psuedo Random Codes for Ultra Wideband Impulse Radio Systems, 4 pages, School of Electronic Engineering, Korea, date unknown.

(Continued)

*Primary Examiner*—Guy J. Lamarre
(74) *Attorney, Agent, or Firm*—Peter R. Martinez

(57) ABSTRACT

A system, method and computer software product are provided. One embodiment of the present invention provides a method for generating and employing numerical sequences that may be used for synchronization codes. In one embodiment of the present invention, the derivation of numerical sequences, or codes is based on an encoding algorithm. These codes enable synchronization between communicating devices, and may also be used for channelization. This Abstract is provided for the sole purpose of complying with the Abstract requirement rules that allow a reader to quickly ascertain the subject matter of the disclosure contained herein. This Abstract is submitted with the explicit understanding that it will not be used to interpret or to limit the scope or the meaning of the claims.

23 Claims, 8 Drawing Sheets

OTHER PUBLICATIONS

Liuqing Yang & Georgios B. Giannakis, Block-Spreading Codes for Impulse Radio Multiple Access through ISI channels, 2002, 5 pages, University of Minnesota, Minneapolis.

Zhengyuan Xu Jim Tang, Multidimentional Orthogonal Design for Ultra Wideband Downlink, 4 pages, University of California, Riverside, date unknown.

Courtney M. Canadeo, Michael A. Temple, Rusty O. Baldwin & Richard A. Raines, Code Selection for Enhancing UWB Multiple Access COmmunication Performance Using TH-PPM and DS-BPSK Modulations, 2003, 9 Pages, Air Force Institute of Technology, Wright-Patterson AFB, Ohio.

Jeffrey R. Foerster, The Performance of a Direct-Sequence Spread Ultra-Wideband System in the Presence of Multipath, Narrowband Interference, and Multiuser Interference, 5 Pages, Intel Labs, Hillsboro, Oregon, date unknown.

Henning F. Harmuth, Applications of Walsh functions in Communications, IEEE Spectrum, Nov. 1969, 10 Pages, University of Maryland.

Kimmo Kettunen, Code Selection for CDMA Systems, S-38.220 Licentiate Course on Signal Processing in Communications, Nov. 13, 1997, 14 Pages.

Navin Kashyap & David L. Neuhoff, Codes for Data Synchronization with Timing, 10 Pages, University of Michigan, Ann Harbor, date unknown.

S. Nobilet, J-F Helard & D. Mottier, Spreading Sequences Selection for Uplink and Downlink MC-CDMA Systems, 8 Pages, France, date unknown.

Michael Park, Preamble, Phy header protection & ACK aided AMC, IEEE P802.15-03/134r1, Wireless Personal Area NetworksMay 5, 2003, 22 Pages, Korea.

* cited by examiner

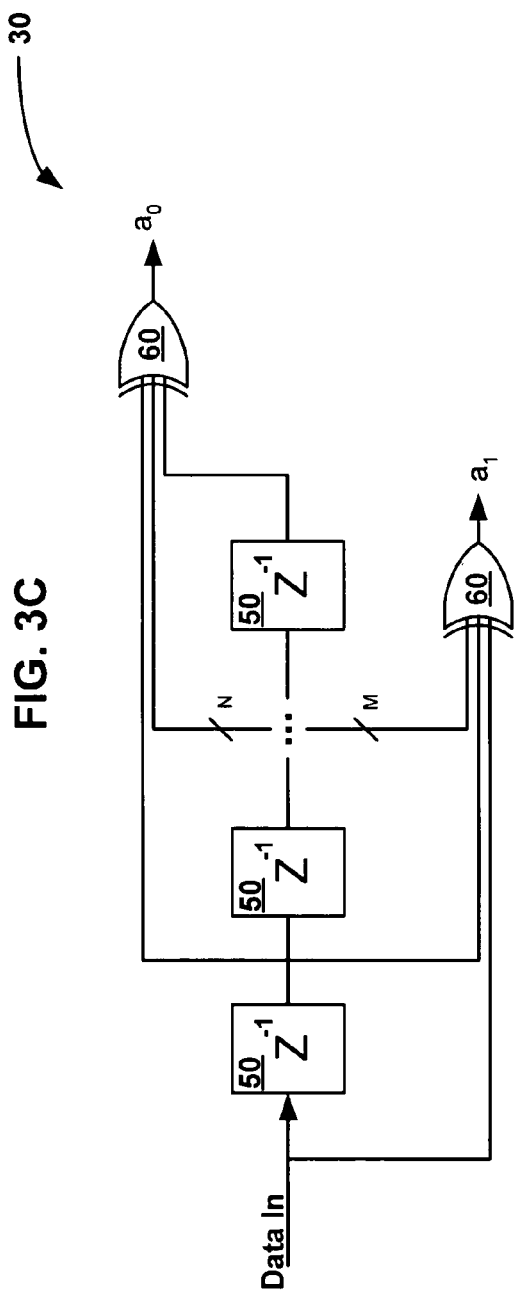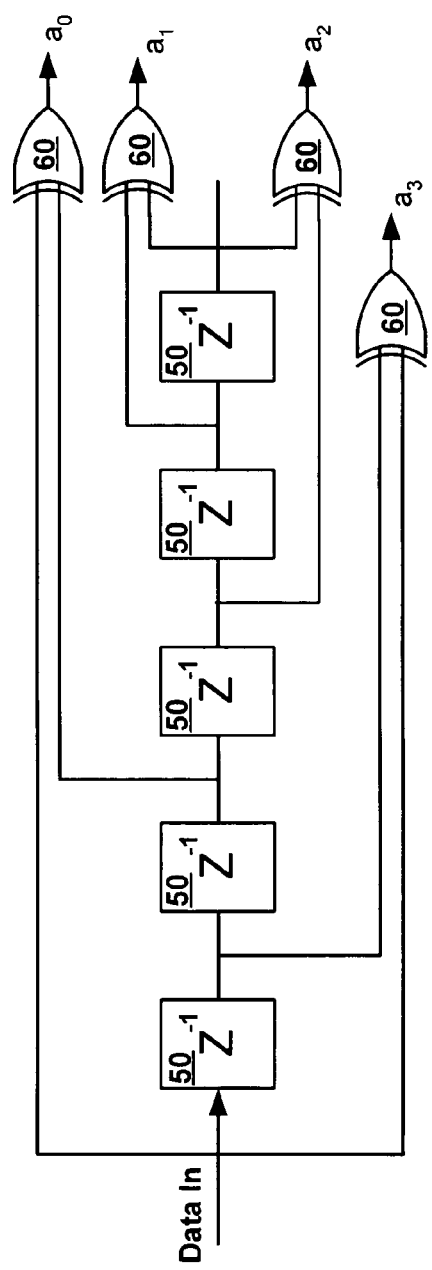
FIG. 3C
FIG. 3D

006
SYNCHRONIZATION CODE METHODS

FIELD OF THE INVENTION

The present invention generally relates to communications. More particularly, the invention concerns systems and methods to derive and employ unique synchronization codes.

BACKGROUND OF THE INVENTION

The Information Age is upon us. Access to vast quantities of information through a variety of different communication systems is changing the way people work, entertain themselves, and communicate with each other.

For example, because of the 1996 Telecommunications Reform Act, traditional cable television program providers have now evolved into full-service providers of advanced video, voice and data services for homes and businesses. A number of competing cable companies now offer cable systems that deliver all of the just-described services via a single broadband network.

These services have increased the need for bandwidth, which is the amount of data transmitted or received per unit time. More bandwidth has become increasingly important, as the size of data transmissions has continually grown. Applications such as in-home movies-on-demand and video teleconferencing demand high data transmission rates. Another example is interactive video in homes and offices.

Other industries are also placing bandwidth demands on Internet service providers, and other data providers. For example, hospitals transmit images of X-rays and CAT scans to remotely located physicians. Such transmissions require significant bandwidth to transmit the large data files in a reasonable amount of time. These large data files, as well as the large data files that provide real-time home video are simply too large to be feasibly transmitted without an increase in system bandwidth. The need for more bandwidth is evidenced by user complaints of slow Internet access and dropped data links that are symptomatic of network overload.

In addition, the wireless device industry has recently seen unprecedented growth. With the growth of this industry, communication between different wireless devices, and the bandwidth of these devices, has become increasingly important. Conventional radio frequency (RF) technology has been the predominant technology for wireless device communication for decades.

Conventional RF technology employs continuous carrier sine waves that are transmitted with data embedded in the modulation of the sine waves' amplitude or frequency. For example, a conventional cellular phone must operate at a particular frequency band of a particular width in the total frequency spectrum. Specifically, in the United States, the Federal Communications Commission (FCC) has allocated cellular phone communications in the 800 to 900 MHz band. Generally, cellular phone operators divide the allocated band into 25 MHz portions, with selected portions transmitting cellular phone signals, and other portions receiving cellular phone signals.

Another type of inter-device communication technology is ultra-wideband (UWB). UWB wireless technology employs discrete pulses of electromagnetic energy and is fundamentally different from conventional carrier wave RF technology. UWB employs a "carrier free" architecture, which does not require the use of high frequency carrier generation hardware, carrier modulation hardware, frequency and phase discrimination hardware or other devices employed in conventional frequency domain communication systems.

One feature of UWB is that a UWB signal, or pulse, may occupy a very large amount of RF spectrum, for example, generally in the order of gigahertz of frequency band. Large amounts of data can be transmitted using UWB technology.

Developers of UWB communication devices have proposed different architectures, or communication methods for ultra-wideband devices. In one approach, the available RF spectrum is partitioned into discrete frequency bands. A UWB device may then transmit signals within one or more of these discrete sub-bands. Alternatively, a UWB communication device may occupy all, or substantially all, of the RF spectrum allocated for UWB communications. Regardless of what type of UWB architecture is employed, consumers will expect these devices to have a high bandwidth capability.

Therefore, there exists a need for methods to increase the bandwidth of wire and wireless networks.

SUMMARY OF THE INVENTION

The present invention provides a system, method and computer program product for deriving and employing unique synchronization codes. In one embodiment of the present invention, the derivation of numerical sequences, or codes, is based on an encoding algorithm. In this embodiment, a convolutional coding rate is selected, and valid, as well as invalid, codes are generated. The invalid codes are then subjected to further analysis, and then employed as synchronization codes.

Synchronization generally comprises transmitting a bit or bits that are used by a receiver to synchronize it with a transmitter. The synchronization codes of the present invention may be used for synchronization between communicating devices. Since the codes are invalid for data, a receiving device will not confuse them for data, thereby increasing the robustness, or Quality of Service of the communication. In addition, the codes may be used for channelization of communications between devices in an environment where there are numerous devices communicating.

These and other features and advantages of the present invention will be appreciated from review of the following detailed description of the invention, along with the accompanying figures in which like reference numerals refer to like parts throughout.

BRIEF DESCRIPTION OF THE DRAWINGS

FIGS. 3A-D illustrate different convolutional encoders;

Figure 1:
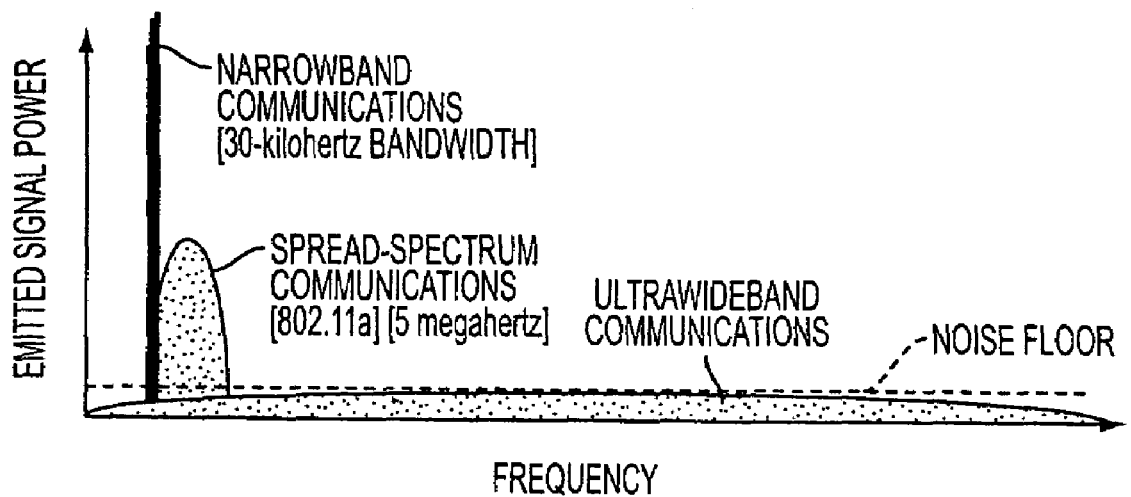
FIG. 1 is an illustration of different communication methods.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

The present invention provides a system and method for communication, wirelessly or through a wire medium, using either conventional carrier wave technology, or ultra-wideband technology. The present invention employs digital communication methods that may be applied to virtually any type of communication system and/or device.

One embodiment of the present invention provides a system, method and computer software product for deriving and employing unique synchronization codes. Briefly, the numerical sequences comprising the synchronization codes are derived from various encoding algorithms and may be used as synchronization codes to enable communication between different communication devices. They are additionally useful for "whitening" spectral lines caused by conventional "fixed" synchronization and channelization codes.

Synchronization (also known as frame synchronization, frame alignment, or framing) generally comprises transmitting a specific sequence of bits that is used by a receiver to synchronize it with the transmitter. For example, a "frame synchronization pattern," generally comprising a recurring pattern of bits, is transmitted that enables the receiver to align its clock, or time reference with the transmitter's time reference. Usually the bit pattern is repeated, which helps ensure that the receiver will have an opportunity to "lock" in on at least one of the transmitted bit patterns. These bit patterns are not data. That is, data generally comprises voice, audio, video, Internet content and/or other types of information.

These synchronization sequences need to be recognizable by the receiver as a synchronization sequence and not be confused with data. For example, in an ultra-wideband (UWB) communication system employing a data modulation technique called pulse position modulation (PPM), each device generates and transmits a pulse of energy in a specific time bin. The location of the time bin (within a symbol slot) determines a bit value, which represents data. Without precise synchronization between the transmitter and the receiver, the receiver may be unable to reliably determine which time bin the pulse is located in, resulting in a high bit-error-rate, and low Quality of Service (QOS).

Additionally, some communication channels may be of poor quality and unable to support the QOS requirements of some data types (video has high QOS requirements, voice has low QOS requirements). In that environment, a number of bit error detection and correction schemes (i.e., algorithms) may be used to improve the QOS. Alternatively, different communication channels may be created by using codes to provide "channelization," which is a method that allows a specific group(s) of users to communicate without interfering with non-intended group(s) of users There are many different types of channelization and error detection/correction algorithms. Broadly, all of these methods are achieved by "encoding" data. Data is encoded by converting it with a code, usually one consisting of binary numbers (i.e., bits), in such a manner that reconversion to the original data is possible. Usually, encoding (or coding) is accomplished by adding additional bits to each group of bits that are to be transmitted (each group of bits may be referred to as a code block, or code). These additional bits are generated by using an encoding algorithm. There are many types of encoding algorithms, for example, memory-based codes (including, among others convolutional codes), memory-less codes (4B/5B, 2B/6B, 10B/8B and 64B/66B, among others). The present invention may use any type of encoding algorithm known today, or yet to be developed.

One embodiment of the present invention derives a set of synchronization codes directly from an encoding algorithm. In this embodiment, one type of encoding algorithm is selected and both valid and invalid codes are generated. "Valid" codes are groups of binary digits (bits) that represent data, whereas, "invalid" codes are bits that do not represent data (also known as "redundant codes," explained in detail below). The invalid codes are subjected to further processing, and then used as synchronization codes. Because these codes are invalid for data, a receiving device will not confuse them for data, thereby increasing the QOS of the communication. In addition, the codes may be used for communication channelization between devices in an environment where there are numerous devices communicating. Additionally, these codes may be used to "whiten" the spectrum created by the use of fixed synchronization codes. Thus a communication system utilizing the numerical codes of the present invention has the advantage of supporting an increased number of devices and additionally "whitening" the spectrum.

As discussed above, the present invention may be employed by conventional carrier wave communication systems, as well as by ultra-wideband (UWB) communication systems. The features of the present invention may be particularly useful in UWB communications. This is because UWB communications employs discrete pulses of electromagnetic energy to transmit data. Each of these discrete pulses may have a duration of nanoseconds or picoseconds. A receiver must synchronize itself by using the received pulses, which is much more difficult than synchronizing to a continuous carrier wave (as is the case in conventional carrier wave communications). Therefore, by using the methods of the present invention, the receiver will be able to more easily distinguish between data bits and synchronization bits.

Figure 2:
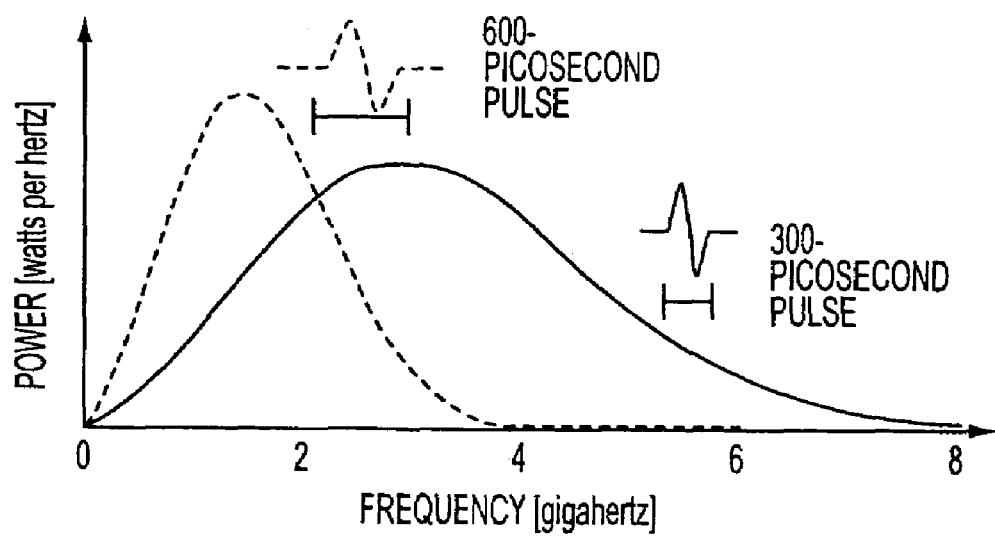
FIG. 2 is an illustration of two ultra-wideband pulses.

Referring to FIGS. 1 and 2, ultra-wideband (UWB) communication employs discrete pulses of electromagnetic energy that are emitted at, for example, nanosecond or picosecond intervals (generally tens of picoseconds to hundreds of nanoseconds in duration). For this reason, ultra-wideband is often called "impulse radio." That is, the UWB pulses may be transmitted without modulation onto a sine wave, or a sinusoidal carrier, in contrast with conventional carrier wave communication technology. UWB generally requires neither an assigned frequency nor a high-power amplifier.

Alternate embodiments of UWB may be achieved by mixing baseband pulses (i.e., information-carrying pulses), with a carrier wave that controls a center frequency of a resulting signal. The resulting signal is then transmitted using discrete pulses of electromagnetic energy, as opposed to transmitting a substantially continuous sinusoidal signal.

An example of a conventional carrier wave communication technology is illustrated in FIG. 1. IEEE 802.11a is a wireless local area network (LAN) protocol, which transmits a sinusoidal radio frequency signal at a 5 GHz center frequency, with a radio frequency spread of about 5 MHz. As defined herein, a carrier wave is an electromagnetic wave of a specified frequency and amplitude that is emitted by a radio transmitter in order to carry information. The 802.11 protocol is an example of a carrier wave communication technology. The carrier wave comprises a substantially continuous sinusoidal waveform having a specific narrow radio frequency (5 MHz) that has a duration that may range from seconds to minutes.

In contrast, an ultra-wideband (UWB) pulse may have a 2.0 GHz center frequency, with a frequency spread of approximately 4 GHz, as shown in FIG. 2, which illustrates two typical UWB pulses. FIG. 2 illustrates that the shorter the UWB pulse in time, the broader the spread of its frequency spectrum. This is because bandwidth is inversely proportional to the time duration of the pulse. A 600-picosecond UWB pulse can have about a 1.8 GHz center frequency, with a frequency spread of approximately 1.6 GHz and a 300-picosecond UWB pulse can have about a 3 GHz center frequency, with a frequency spread of approximately 3.2 GHz. Thus, UWB pulses generally do not operate within a specific frequency, as shown in FIG. 1. Either of the pulses shown in FIG. 2 may be frequency shifted, for example, by using heterodyning, to have essentially the same bandwidth but centered at any desired frequency. And because UWB pulses are spread across an extremely wide frequency range, UWB communication systems allow communications at very high data rates, such as 100 megabits per second or greater.

Also, because the UWB pulses are spread across an extremely wide frequency range, the power sampled in, for example, a one megahertz bandwidth, is very low. For example, UWB pulses of one nano-second duration and one milliwatt average power (0 dBm) spreads the power over the entire one gigahertz frequency band occupied by the pulse. The resulting power density is thus 1 milliwatt divided by the 1,000 MHz pulse bandwidth, or 0.001 milliwatt per megahertz (−30 dBm/MHz).

Generally, in the case of wireless communications, a multiplicity of UWB pulses may be transmitted at relatively low power density (milliwatts per megahertz). However, an alternative UWB communication system may transmit at a higher power density. For example, UWB pulses may be transmitted between 30 dBm to −50 dBm.

UWB pulses, however, transmitted through many wire media will not interfere with wireless radio frequency transmissions. Therefore, the power (sampled at a single frequency) of UWB pulses transmitted though wire media may range from about +30 dBm to about −140 dBm.

The present invention may be employed in any type of network, be it wireless, wire, or a mix of wire media and wireless components. That is, a network may use both wire media, such as coaxial cable, and wireless devices, such as satellites, or cellular antennas. As defined herein, a network is a group of points or nodes connected by communication paths. The communication paths may use wires or they may be wireless. A network as defined herein can interconnect with other networks and contain sub-networks. A network as defined herein can be characterized in terms of a spatial distance, for example, such as a local area network (LAN), a personal area network (PAN), a metropolitan area network (MAN), a wide area network (WAN), and a wireless personal area network (WPAN), among others. A network as defined herein can also be characterized by the type of data transmission technology used by the network, such as, for example, a Transmission Control Protocol/Internet Protocol (TCP/IP) network, a Systems Network Architecture network, among others. A network as defined herein can also be characterized by whether it carries voice, data, or both kinds of signals. A network as defined herein may also be characterized by users of the network, such as, for example, users of a public switched telephone network (PSTN) or other type of public network, and private networks (such as within a single room or home), among others. A network as defined herein can also be characterized by the usual nature of its connections, for example, a dial-up network, a switched network, a dedicated network, and a non-switched network, among others. A network as defined herein can also be characterized by the types of physical links that it employs, for example, optical fiber, coaxial cable, a mix of both, unshielded twisted pair, and shielded twisted pair, among others.

The present invention may be employed in any type of wireless network, such as a wireless PAN, LAN, MAN, or WAN. In addition, the present invention may be employed in wire media, such as coaxial cable, fiber optic cable, twisted-pair media, and any other types of wire media.

As discussed above, the present invention generates and employs unique synchronization codes that improve QOS and can also support a multi-user communication environment by being employed as channelization codes (i.e., codes that allow specific groups of users to communicate, without interfering with non-intended groups of users).

As also discussed above, synchronization sequences, or codes, comprised of groups of bits, need to be recognizable by the receiver as such, and not be confused with data. In addition, some communications channels may be of poor quality and unable to support the Quality of Service (QOS) requirements of some data types. To address these, and other issues, a number of encoding algorithms (as discussed above) may be used to improve the QOS, and provide robust synchronization codes.

One type of encoding algorithm that may be employed by the present invention are known as memory-less coding. One such algorithm is commonly referred to as linear block coding. In block codes, a block of k data bits is encoded by a codeword of n digits where n>k. For every sequence of k data bits, there is a distinct code word of n digits. One feature of block coding is that it directly converts every block of k data bits into a code word of n digits regardless of what data was previously processed. For example, one such block coding algorithm is known as 4B-5B coding. In 4B-5B coding, every 4 bits is replaced by 5 bits. In this example there are $2^5-2^4=16$ invalid codes, or redundant codes that do not represent data. Coding efficiency of this algorithm is therefore $$\frac{4 \text{ bits}}{5 \text{ bits}} = 80\%.$$

Other coding methods of this type, such as 2B-6B, will result in different numbers of invalid codes, but in general, if there are k input bits encoded into n output bits there will be $2^n-2^k$ codes that are invalid and do not represent data.

TABLE 1

| Data Bits | Encoded Data Bits | Valid/Invalid |
|---|---|---|
| 00 | 000 | Valid code |
| 01 | 001 | Valid code |
| 10 | 010 | Valid code |
| 11 | 100 | Valid code |
|  | 011 | Invalid code |
|  | 101 | Invalid code |
|  | 110 | Invalid code |
|  | 111 | Invalid code |

For example, TABLE 1 illustrates a hypothetical coding algorithm that encodes four data bits ($2^2$), using a $2^3$ encoder. In this example, $2^3-2^2=4$ groups of numbers (011, 101, 110 and 111) are invalid, or redundant codes that do not represent data.

Another type of encoding algorithm that may be employed by the present invention is memory-based, such as convolutional encoding, which in some versions uses a byte format (1 byte=8 bits, where a bit is either a 1 or a 0). Convolutional encoding is a memory-dependent encoding algorithm. That is, the present state of the encoder is dependent on data that has previously been processed. Additionally, the output of the encoder depends on the present state of the encoder and the data input to the encoder. Systems that use convolutional encoding may also employ a Viterbi decoder in the receiver to decode the data, and to detect and correct errors. In this case, each set of 8 bits (one byte) when convolutionally encoded by a $\frac{1}{2}$ rate encoder becomes a set of 16 bits (one word). Since there are 256 possible combinations of 8 bits ($2^8=256$) and 65,536 combinations of 16 bits ($2^{16}=65,536$), there are a total of 65,536−256=65,280 combinations that if transmitted or received would not represent a valid data byte without considering the state of the encoder. For a 3 state encoder the number of valid data byte combinations is increased by a factor of $2^3$. In this encoder there would be $2^{16}-2^8*2^3=63,348$ invalid codes. In general, if there are k input bits, a coding rate of $\frac{1}{l}$ and m states in the encoder, there will be $2^n-2^{m+k}$ codes (where n=k*l) that are invalid codes. It will be appreciated that there are other coding rates, beyond $\frac{1}{2}$ rate coding, that may be used by the present invention.

These invalid numerical codes, which may be produced by any type of encoding algorithm, provide candidates for synchronization sequences, or codes, since they should never represent valid data. Once the receiver detects the presence of one of these codes it can then reset its timing reference, and the receiver and transmitter will be synchronized.

However, some invalid codes may be better than other invalid codes for synchronization sequences. There are several characteristics of an invalid code that make it better than others.

One characteristic of importance is how similar a valid data code is to the invalid code. This can be calculated by the number of bits that are dissimilar between the invalid code and all the valid data codes. This characteristic is generally referred to as a "Hamming distance." Put simply, the Hamming distance counts number of bits that disagree between two bit sequences. In TABLE 1 above, the Hamming distance between valid code 000 and invalid code 111 would be 3, as none of the three bits in each code are the same. A high Hamming distance indicates a low probability of corruption of the decoded data.

Another characteristic that makes an invalid code better than others for synchronization codes is the shape of the autocorrelation function of the code. Autocorrelation is a measure of the similarity between delayed and undelayed versions of the same signal, or code. Mathematically, autocorrelation is defined as follows:

$$R_g(t) = \lim_{T \to \infty} \frac{1}{T} \int_{-T/2}^{T/2} g(t)g(t-\tau)dt$$

The formula describes a process in which the code g(t) is multiplied by a time shifted copy of the code g(t−τ). The product of these two copies of the code will integrate to a lower value when the time shift is such that there is little bit-by-bit correspondence between the two copies. As the time shift goes to zero, the two functions approach a perfect bit correspondence condition and the integral becomes a maximum value. As the shifted copy passes the original copy there is again little correspondence between codes and the product decreases. Since the receiver is looking for a specific code to synchronize, a code with a good autocorrelation will have low values when shifted and an extremely high value when perfectly overlapped. This high value allows the receiver to determine the timing reference of the transmitter with a high degree of precision.

Yet another characteristic that makes some invalid codes better than others, is that in some cases synchronization codes that have a balanced number of ones and zeros are desirable. For example, a receiver demodulating data using OOK (on-off keying, a data modulation method) may encounter difficulties with codes that have a predominance of 0's. This is because in OOK modulation, the data bit "0" is represented by the absence of a pulse (i.e., the absence of energy). In this case, a better synchronization code for this type of modulation may have a balanced number of 1's and 0's.

Figure 3A:
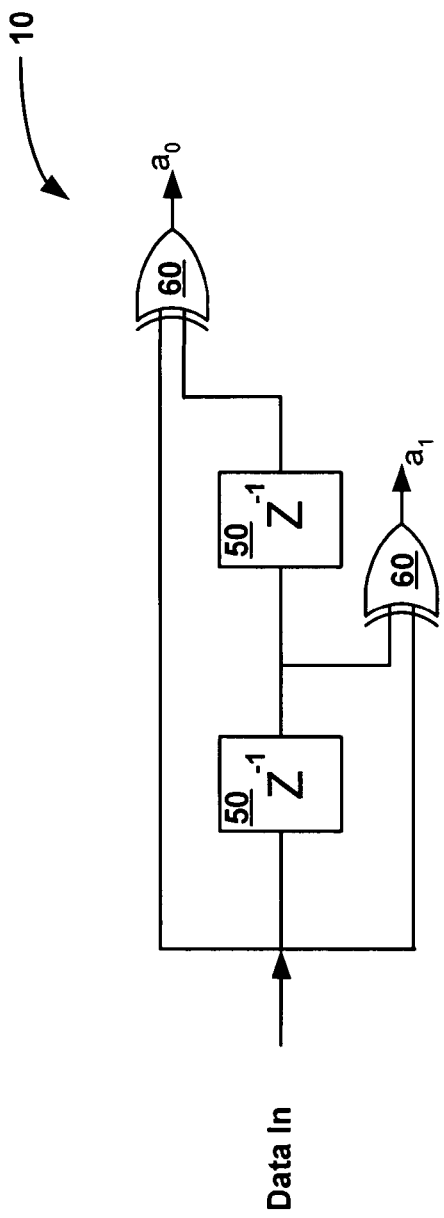
Figure 3B:
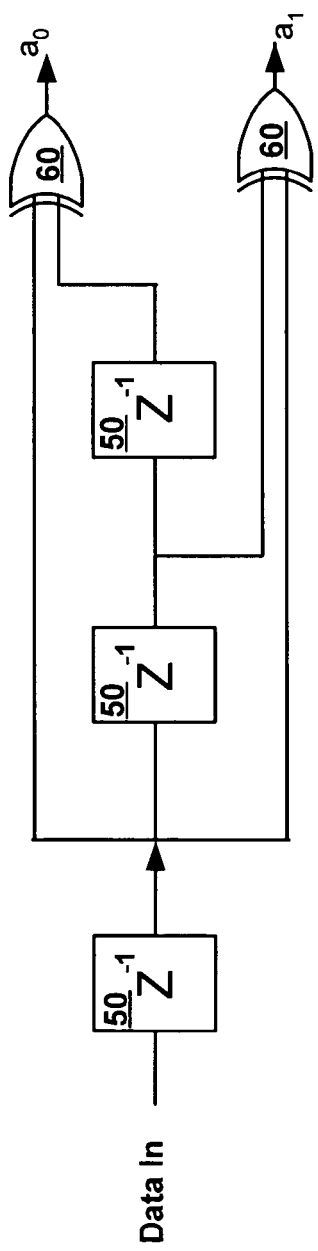

Referring now to FIGS. 3A-D, which illustrate convolutional encoders that may be employed by the present invention. Convolutional encoders 10, 20, 30, and 40 comprise a multiplicity of synchronous delay elements 50 and "exclusive or" functions 60. The number of synchronous delay elements 50 is commonly referred to as the constraint level. At a receiver a Viterbi decoder with a matching constraint level may be used to detect and correct errors. As shown in FIGS. 3A-C, convolutional encoders 10, 20, and 30 depict a $$\frac{1}{2}$$

rate encoding, because for every data bit that is input, two data bits $a_0$ and $a_1$ are produced. FIG. 3C also shows that the encoder could be expanded by including "M" and "N" busses, that may expand the number of synchronous delay elements 50 and "exclusive or" functions 60. It will be appreciated that other constructions of convolutional encoders may be employed by the present invention.

Illustrated in FIG. 3D, convolutional encoder 40 depicts a $$\frac{1}{4}$$

rate encoder. In encoder 40, 4 data bits $a_0$ through $a_3$ are produced for every input data bit. Using a $$\frac{1}{4}$$

rate encoder 40 allows for a larger set of invalid codes as compared to the $$\frac{1}{2}$$

encoder, but suffers from significantly increased communication overhead.

Figure 4:
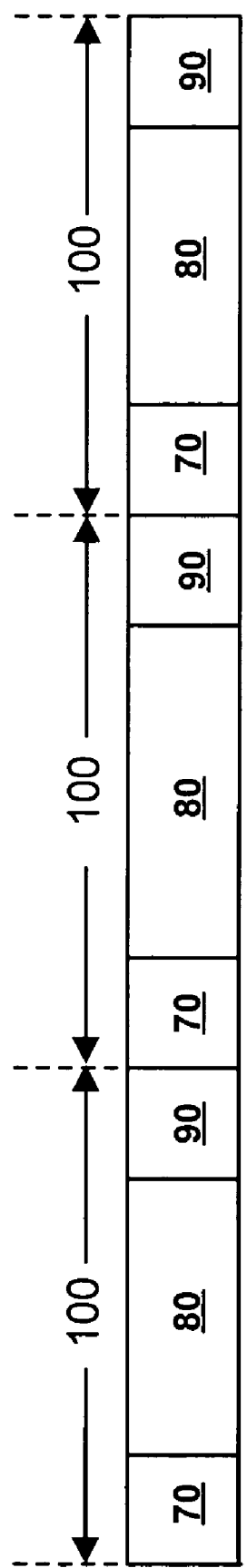
FIG. 4 illustrates a group of communication frames.

Referring now to FIG. 4, frames 100 may include a preamble and synchronization portion 70, a data payload section 80, and an error detection section 90. A "frame" 100 as defined herein, includes many different constructions and arrangements. Generally, a "frame" 100 is a sequence of bits delimited by, and including, beginning and ending flag sequences. Flag sequences generally comprise a sequence of bits used to mark the beginning and/or end of a frame 100. However, if the sequence length is known, an ending flag sequence is not necessary. As shown in FIG. 4, a flag sequence may be in the preamble and synchronization section 70 and/or the error detection section 80. A frame 100 may be of different lengths, and contain variable amounts of data.

A frame 100 usually consists of a representation of the original data to be transmitted (generally comprising a specified number of bits), together with other bits that may be used for error detection or control. Additional bits may be used for routing (possibly in the form of an address field), synchronization, overhead information not directly associated with the original data, and a frame check sequence (also known as a cyclic redundancy check). The preamble and synchronization section 70 may include routing information, such as a source address, a destination address, and other information.

As shown in FIG. 4, if fixed length, or fixed time duration, frames 100 are transmitted, it will cause the preamble and synchronization section 70 portion of the frame 100 to be repeated at some regular periodicity. If the synchronization sequence within the preamble and synchronization section 70 is identical through a series of frames 100, spectral lines will develop at a frequency corresponding to the inverse of the time duration of one frame 100. For example, if the time period of a frame 100 is 200 microseconds, and the preamble and synchronization portion 70 of each frame 100 contains the same synchronization code, the code will be repeated every 200 microseconds. This repetition of the code will generate a spectral line at a frequency of 5 kilohertz $$\left(\text{i.e., } \frac{1}{200e-6}\right).$$

This repetition will additionally create spectral lines at the integer harmonics of 5 kilohertz.

However, if different synchronization sequences are employed, the same pattern will not occur with the 200 microsecond periodicity and the spectral lines will be reduced and the spectrum whitened.

Figure 5:
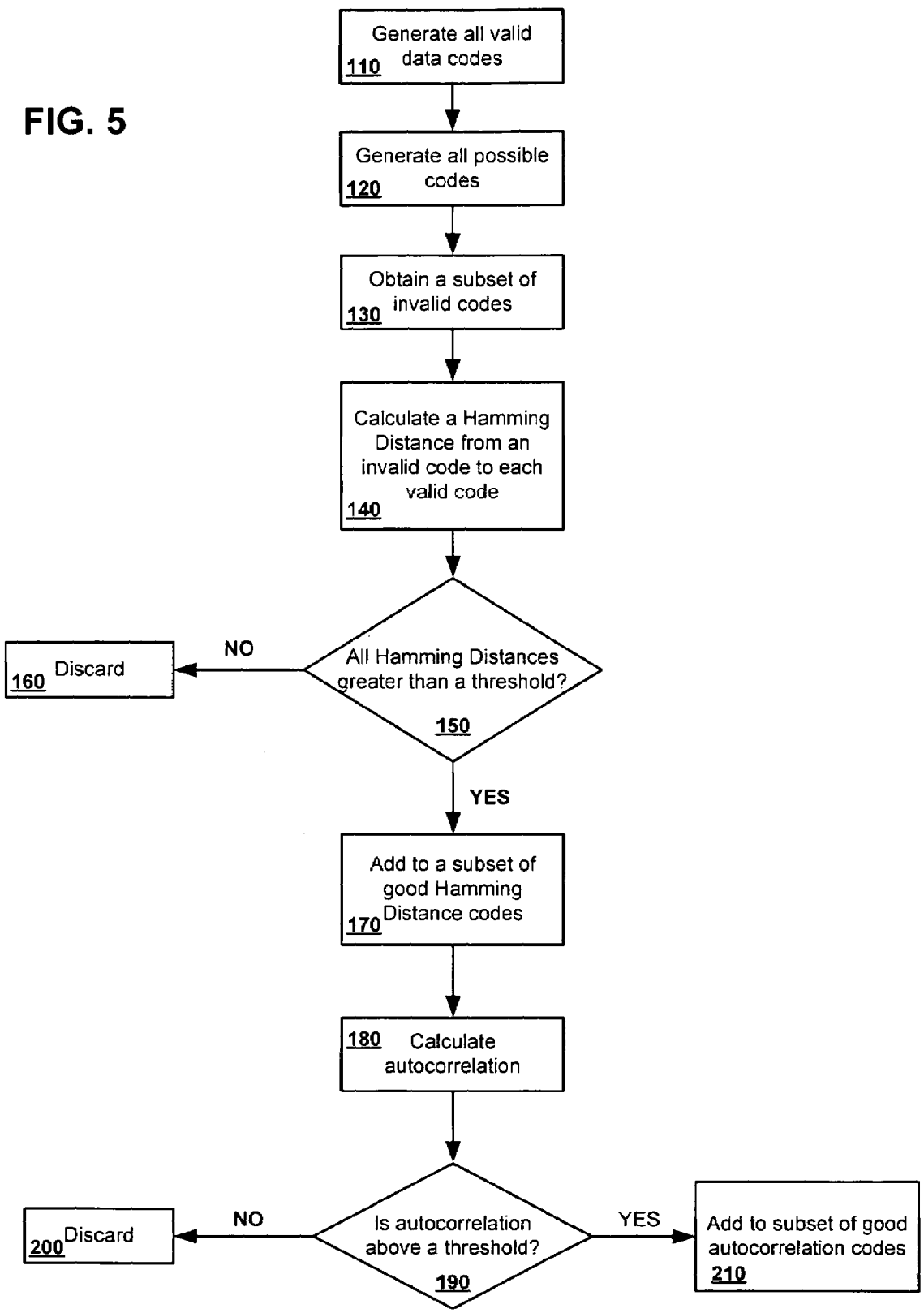
FIG. 5 illustrates one method of deriving numerical codes according to one embodiment of the present invention.
Figure 6:
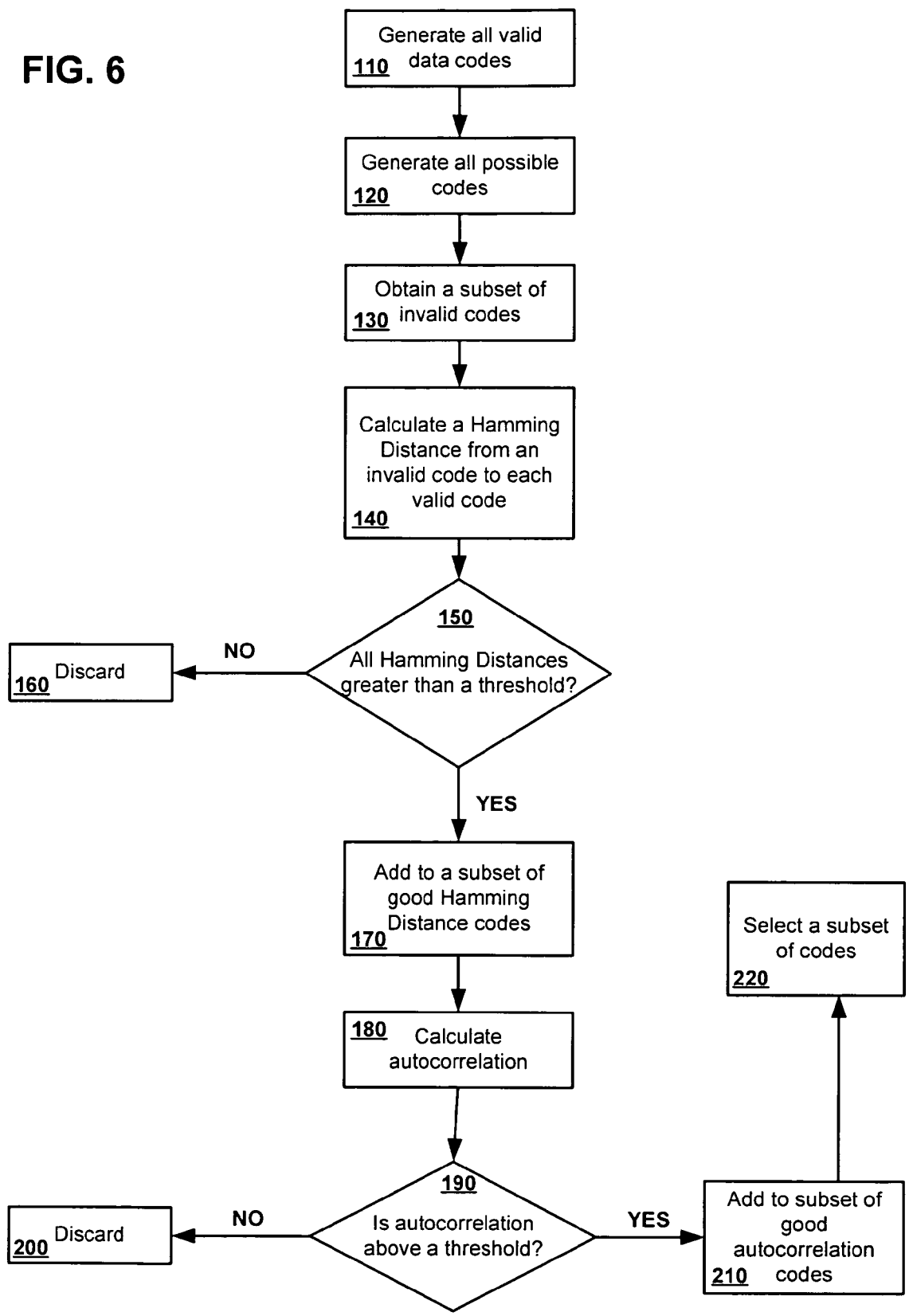
FIG. 6 illustrates a second method of deriving numerical codes according to a second embodiment of the present invention.
Figure 7:
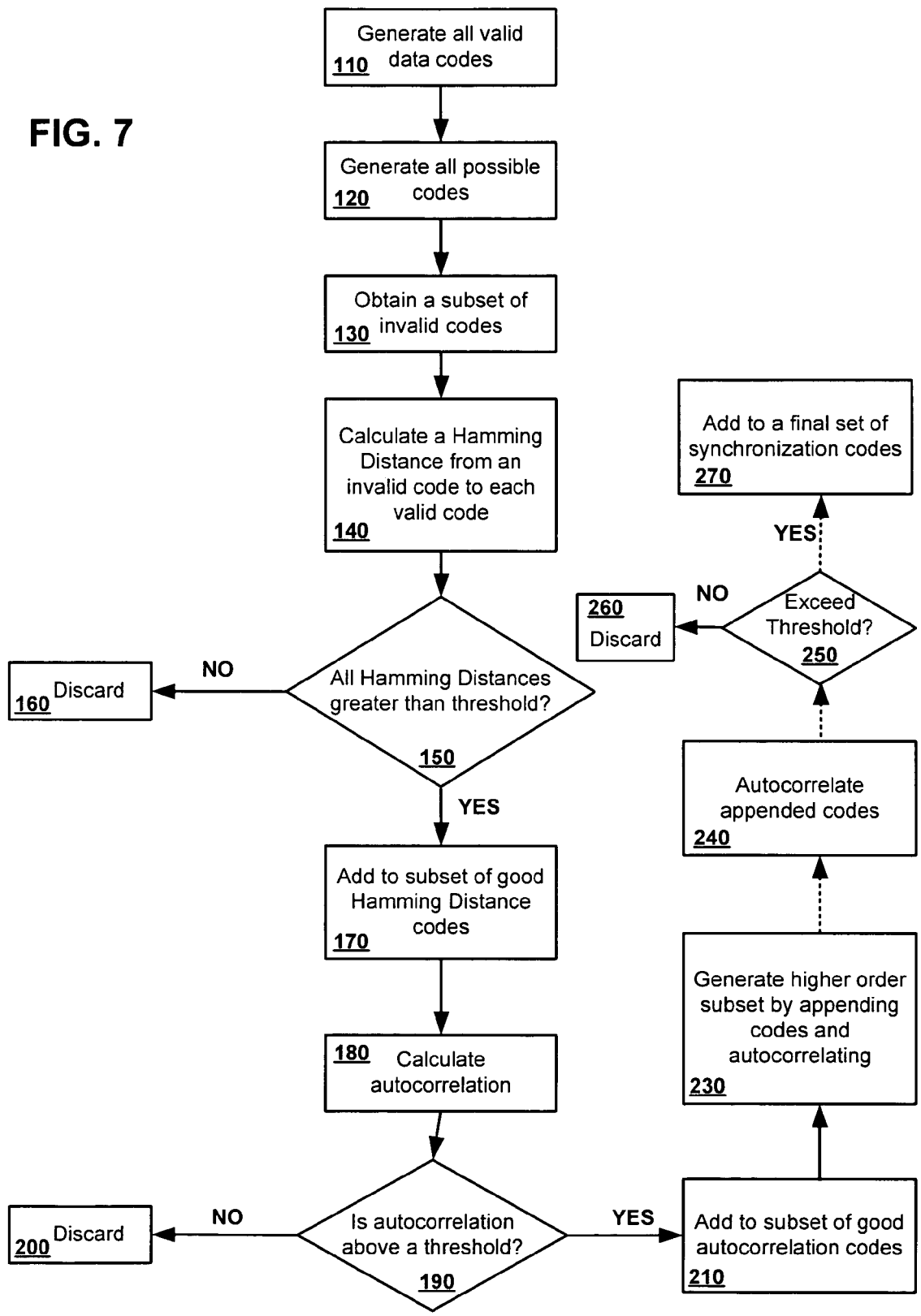
FIG. 7 illustrates a third method of deriving numerical codes according to a third embodiment of the present invention.

FIGS. 5, 6, and 7 illustrate several different methods for code generation consistent with several different embodiments of the present invention. As shown in FIG. 5, in step 110 all valid data codes are generated by taking all possible combinations of data and performing a convolutional coding. For example, as illustrated in TABLE 2 below, all combinations of valid data for a 4-bit data sequence are shown in the column titled "data." The corresponding valid data codes for a ½ rate convolutional coding scheme may be as shown in the column titled "½-Rate Convolutional Coding Output." Since the output of ½ rate convolutional coding produces an 8-bit word from a 4-bit code, there are 240 ($2^8-2^4=240$) 8-bit words that could not represent data. These are the invalid codes. These 240 8-bit words form a subset of invalid codes that may be used for synchronization codes. In step 120 all possible codes are generated. In this example, the set of all possible codes would contain all combinations of unique 8-bit words. In step 130 the valid data codes are eliminated from the set of all possible codes leaving the subset of invalid codes (240 invalid codes in this example).

As discussed above, the Hamming Distance is a representation of how different two codes are. In step 140 the Hamming Distance is calculated by comparing each of the subset of invalid codes to each of the valid codes. The Hamming Distance is the number of bits that are different in the two compared codes. This is an indication of how robust the code is to misinterpretation in the case of bit error. In step 150 a threshold is applied to each calculation of Hamming Distance. The threshold may be the maximum Hamming Distance, or it may be less than the maximum Hamming Distance. If the code under consideration has a Hamming distance from each valid data code that exceeds the threshold, it is added to the subset of good Hamming Distance codes in step 170. If the Hamming Distance between the code and any valid data code is below the threshold, the code is discarded in step 160. Steps 140, 150 and 160 and 170 are repeated as necessary until all of the subset of invalid codes produced by step 130 have been evaluated.

TABLE 2

| Data | ½-Rate Convolutional Coding Output |
|---|---|
| 0000 | 00000000 |
| 0001 | 00010000 |
| 0010 | 00100001 |
| 0011 | 00110001 |
| 0100 | 01010011 |
| 0101 | 01000011 |
| 0110 | 01110010 |
| 0111 | 01100010 |
| 1000 | 10100110 |
| 1001 | 10110110 |
| 1010 | 10000111 |
| 1011 | 10010111 |
| 1100 | 11110101 |
| 1101 | 11000111 |
| 1110 | 11010100 |
| 1111 | 11000100 |

Autocorrelation, as described above, provides an indication of whether a time-shifted version of a code may be misinterpreted as the code itself. In step 180 the autocorrelation is calculated for all of the subset of good Hamming Distance codes. A "good" autocorrelation will have a peak value that is substantially higher than the highest non-peak value. By comparison of the peak value to the highest non-peak value codes with "good" autocorrelations may be selected. In step 190 the ratios of peak to non-peak values of the autocorrelations previously calculated in step 180 are compared to a threshold value. The threshold value may be chosen by collecting the largest non-peak value for each pattern, then choosing the smallest of these. Put differently, the threshold value may be the lowest value of the greatest non-peak value. However, other threshold values may be chosen. Ideally the highest non-peak value will be less than 10% of the peak value. If the peak to highest non-peak threshold is exceeded the code is added to the subset of "good" autocorrelation codes in step 210. If the threshold is not exceeded, the code is discarded in step 200. Steps 180, 190, 200, and 210 are repeated until all of the codes have been evaluated. Depending upon the threshold value, the subset of codes that are finally generated may be limited to a very few codes. In the event that more codes are desired the selected threshold value may be increased (i.e., the peak to non-peak ratio acceptance value may be decreased).

Referring now to FIG. 6, in this embodiment of the invention, an additional step 220 is added to the steps discussed in FIG. 5. The additional step 220 further sorts the subset of codes with good autocorrelations to a subset where the number of 1's and 0's are substantially the same ("balanced codes"). One feature of this embodiment is that it substantially reduces the problem of a receiver receiving long strings of 0's or long strings of 1's. This may occur, for example, when receiving data that has been modulated by using On-Off-Keying, or other modulation techniques. By using codes that have a balanced number of 1's and 0's, long strings of the same bit are eliminated from the synchronization codes.

Referring now to FIG. 7, in this embodiment of the invention, longer code sequences are derived from the subset of codes having good autocorrelation. The same method steps shown in FIG. 5 are performed, and then in step 230 a number of codes are selected from the subset, and the codes are appended onto one another to form a variety of different combinations of codes. For example, as shown in TABLE 2, the first two of the ½-Rate Convolutional Codes could be appended to form a new code comprising 0000000000010000. Other arrangements of appended codes may be formed, such as appending more than two codes together. Because each of the codes has already been autocorrelated, the new appended codes retain their advantageous autocorrelation properties. However, in an optional step 240, the appended codes may be autocorrelated again. And in optional step 250, the autocorrelated codes may be compared with a threshold, and either added to a final set of synchronization codes in step 270, or discarded in step 260.

One feature of the embodiment illustrated in FIG. 7 is that codes containing many bits can be easily constructed. Synchronization codes containing multiple bits can provide robust synchronization, thereby allowing for less frequent synchronization, and enabling larger data payloads. Conventional methods of deriving synchronization codes having large numbers of bits can be computationally intensive. For example, a code comprising 32 bits would require the generation of all possible combinations, which is $2^{32}$=4,294,967,296 individual codes. Each of these 4.3 billion codes must then be checked against each of the valid data codes. Thus, this algorithm quickly becomes unworkable.

However in the embodiment illustrated in FIG. 7, a 32 bit code may be constructed by appending the codes together. For example, with reference to TABLE 2, the first four of the ½-Rate Convolutional Codes could be appended to form a new code that would comprise 32 bits. Because each of the codes has already been autocorrelated, the new appended codes retain their advantageous autocorrelation properties. In this fashion, long bit codes can be constructed without performing intensive computations.

As shown in FIGS. 5, 6, and 7, the Hamming Distance is calculated, and then the autocorrelation is calculated. It will be appreciated that this order may be reversed, with the autocorrelation calculation first, followed by the Hamming Distance calculation. The calculations and/or derivations as discussed herein may be performed by a general purpose digital computer, as well as by other computing devices.

Synchronization codes that have been generated using the methods illustrated in FIG. 5, 6 or 7 have several features. As mentioned above, they may be used to "whiten" the radio frequency spectrum that otherwise contains spectral lines created by periodically transmitting a fixed synchronization sequence. In this embodiment, a transmitter and receiver may "hop" among different synchronization codes, rather than repeating the same codes. Externally, this hopping sequence (which may be a pseudo-random hopping sequence) appears random, and will reduce the formation of spectral lines that may be created by repetitively transmitting a fixed sequence at the beginning of frame 100. In addition, hopping can provide a secure communication channel.

Figure 8:
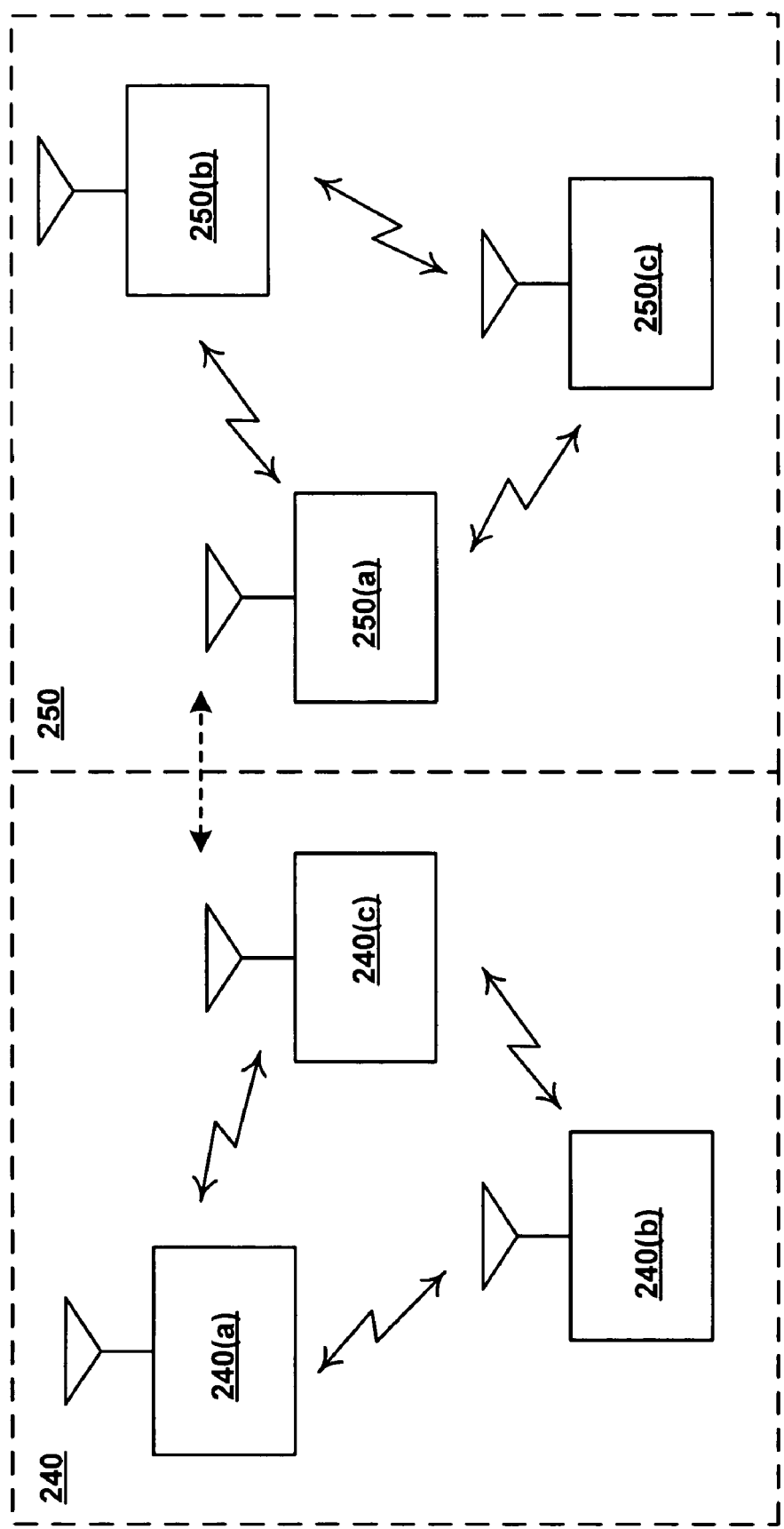
FIG. 8 illustrates two pico-nets within the same geographical area.

Referring to FIG. 8, two pico-nets 240 and 250 are illustrated. One feature of the present invention is that the synchronization codes may be used to provide channelization between ultra-wideband devices communicating in a common geographical area. In this embodiment, one pico-net may use one set of synchronization codes and another closely located pico-net may use a different set of codes. To an ultra-wideband device within the first pico-net, the transmissions of an ultra-wideband device within the second pico-net will not be received since the first device is synchronized to a different code sequence. This allows multiple users to operate without interfering with each other within a geographical area, which can increase the total number of supported users.

Generally, a piconet is a group of two or more devices operating with a common media access controller (MAC), which are associated in some manner. For example, several ultra-wideband (UWB) communication devices, all with the same, or similar MACs may be located in a common geographical area. Two different groups may be communicating among themselves using these UWB devices. To avoid having one group's signals interfere with the second group's signals, different synchronization codes are used for each group, thus "channelizing" communication among the two groups.

As shown in FIG. 8, there are two pico-nets 240 and 250. Devices communicating within pico-net 240 may comprise devices 240(a), 240(b), and 240(c), and in like manner pico-net 250 may comprise devices 250(a), 250(b) and 250(c). In one embodiment of the present invention, a subset of synchronization codes may be assigned to pico-net 240, for use by devices 240(a), 240(b), and 240(c). A different subset of synchronization codes may be assigned to pico-net 250, for use by devices 250(a), 250(b), and 250(c). Communication signals received by a device in pico-net 240, 240(a) for example, that are using a code assigned to pico-net 250, may be ignored by device 240(a) since device 240(a) will not synchronize to a code sequence used in pico-net 250.

Thus, it is seen that a system, method and computer software product for generating and employing unique synchronization codes is provided. One skilled in the art will appreciate that the present invention can be practiced by other than the above-described embodiments, which are presented in this description for purposes of illustration and not of limitation. The description and examples set forth in this specification and associated drawings only set forth preferred embodiment(s) of the present invention. The specification and drawings are not intended to limit the exclusionary scope of this patent document. Many designs other than the above-described embodiments will fall within the literal and/or legal scope of the following claims, and the present invention is limited only by the claims that follow. It is noted that various equivalents for the particular embodiments discussed in this description may practice the invention as well.

What is claimed is:

1. A computer program product in a computer readable medium, the computer program product stored comprising instructions being executed by a computer for deriving numerical sequences, the instructions comprising the steps of:
    providing data, the data comprising $2^k$ combinations of bits, where k is an integer;
    encoding the data by generating $2^n$ combinations of bits where n is an integer greater than k;
    generating a group of valid data codes and a group of invalid data codes from the encoded data;
    generating a Hamming distance between each of the invalid data codes and each of the valid data codes; and
    generating an autocorrelation function for each of the invalid data codes.

2. The computer program product of claim 1, further comprising the step of selecting the invalid data codes having a Hamming Distance greater than a first threshold.

3. The computer program product of claim 2, wherein the first threshold comprises a maximum Hamming Distance.

4. The computer program product of claim 1, further comprising the step of selecting the invalid data codes having a Hamming Distance greater than a first threshold and an autocorrelation greater than a second threshold.

5. The computer program product of claim 4, wherein the first threshold comprises a maximum Hamming Distance, and the second threshold comprises a lowest value of a greatest non-peak autocorrelation value.

6. The computer program product of claim 1, further comprising the steps of:
    selecting the invalid data codes having a Hamming Distance greater than a first threshold and an autocorrelation greater than a second threshold; and
    using at least one of the selected invalid data codes as a synchronization code.

7. The computer program product of claim 6, wherein the first threshold comprises a maximum Hamming Distance, and the second threshold comprises a lowest value of a greatest non-peak autocorrelation value.

8. The computer program product of claim 1, wherein the step of generating the autocorrelation is performed before the step of generating the Hamming distance.

9. The computer program product of claim 1, wherein the step of generating a group of valid data codes comprises selecting encoded bits that represent data.

10. The computer program product of claim 1, wherein the step of generating a group of invalid data codes comprises selecting encoded bits that do not represent data.

11. The computer program product of claim 1, further comprising the step of selecting the invalid data codes having substantially the same number of ones and zeros.

12. The computer program product of claim 1, further comprising the step of appending at least two invalid data codes together.

13. A computer program product stored in a computer readable medium, the computer program product comprising instructions being executed by a computer for directing a general purpose digital computer to derive numerical sequences, comprising:
    obtaining data, the data comprising $2^k$ combinations of bits, where k is an integer;
    a set of computer readable instructions to encode the data by generating $2^n$ combinations of bits where n is an integer greater than k;
    a set of computer readable instructions to generate a group of valid data codes and a group of invalid data codes from the encoded data;
    a set of computer readable instructions to generate a Hamming distance between each of the invalid data codes and each of the valid data codes; and
    a set of computer readable instructions to generate an autocorrelation function for each of the invalid data codes.

14. The computer program product of claim 13, wherein the set of computer readable instructions to encode the data comprises a memory-based encoding algorithm.

15. The computer program product of claim 14, wherein the memory-based encoding algorithm comprises a convolutional encoding algorithm.

16. The computer program product of claim 13, wherein the set of computer readable instructions to encode the data comprises a memory-less algorithm.

17. The computer program product of claim 16, wherein the memory-less algorithm comprises a block encoding algorithm.

18. The computer program product of claim 13, further comprising a set of computer readable instructions that select the invalid data codes having a maximum Hamming Distance.

19. The computer program product of claim 13, further comprising a set of computer readable instructions that select the invalid data codes having a maximum Hamming Distance and an autocorrelation having a lowest value of a greatest non-peak autocorrelation value.

20. The computer program product of claim 13, further comprising:
- a set of computer readable instructions that select the invalid data codes having a maximum Hamming Distance and an autocorrelation greater than a second threshold; and
- a set of computer readable instructions that use at least one of the selected invalid data codes as a synchronization code.

21. The computer program product of claim 13, wherein autocorrelation of each of the invalid data codes is performed before generation of the Hamming distance.

22. The computer program product of claim 13, further comprising a set of computer readable instructions that select the invalid data codes having substantially the same number of ones and zeros.

23. The computer program product of claim 13, further comprising a set of computer readable instructions that append at least two invalid data codes together.

* * * * *